US006967841B1

(12) United States Patent
Chu et al.

(10) Patent No.: US 6,967,841 B1
(45) Date of Patent: Nov. 22, 2005

(54) COOLING ASSEMBLY FOR ELECTRONICS DRAWER USING PASSIVE FLUID LOOP AND AIR-COOLED COVER

(75) Inventors: Richard C. Chu, Hopewell Junction, NY (US); Michael J. Ellsworth, Jr., Lagrangeville, NY (US); Roger R. Schmidt, Poughkeepsie, NY (US); Robert E. Simons, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 50 days.

(21) Appl. No.: 10/841,748

(22) Filed: May 7, 2004

(51) Int. Cl.[7] .............................................. H05K 7/20

(52) U.S. Cl. ...................... 361/700; 361/695; 361/699; 165/80.4; 165/104.17; 174/15.1; 174/15.2; 257/714; 257/715

(58) Field of Search ................................ 361/689, 690, 361/695–700, 715–721; 257/714, 715; 174/15.1, 174/15.2, 16.1, 16.3; 165/80.4, 104.17, 104.26

(56) References Cited

U.S. PATENT DOCUMENTS

| | | | | |
|---|---|---|---|---|
| 4,951,740 | A | 8/1990 | Peterson et al. | 165/32 |
| 5,206,791 | A | 4/1993 | Novotny | 361/385 |
| 5,229,915 | A | 7/1993 | Ishibashi et al. | 361/385 |
| 5,944,093 | A | 8/1999 | Viswanath | 165/104.26 |
| 6,125,644 | A | 10/2000 | Chiu et al. | 62/259.2 |
| 6,804,117 | B2 * | 10/2004 | Phillips et al. | 361/700 |
| 6,807,056 | B2 * | 10/2004 | Kondo et al. | 361/689 |
| 6,853,554 | B2 * | 2/2005 | Bash et al. | 361/699 |
| 6,914,780 | B1 * | 7/2005 | Shanker et al. | 361/687 |
| 6,924,978 | B2 * | 8/2005 | DiStefano | 361/688 |
| 2001/0023757 | A1 | 9/2001 | Huang | |
| 2001/0040022 | A1 | 11/2001 | Hao | |
| 2001/0050164 | A1 | 12/2001 | Wager et al. | |
| 2002/0075652 | A1 | 6/2002 | Berchowitz | |
| 2003/0147214 | A1 * | 8/2003 | Patel et al. | 361/699 |
| 2003/0174468 | A1 * | 9/2003 | Park et al. | 361/700 |
| 2004/0052052 | A1 * | 3/2004 | Rivera | 361/700 |

FOREIGN PATENT DOCUMENTS

| | | | |
|---|---|---|---|
| JP | 54014169 | 2/1979 | H01L 23/44 |
| JP | 56051848 A | 5/1981 | H01L 23/44 |
| JP | 1037899 A | 2/1989 | H05K 7/20 |

* cited by examiner

*Primary Examiner*—Boris Chérvinsky
(74) *Attorney, Agent, or Firm*—Lily Neff; Andrew J. Woinicki, Jr.

(57) ABSTRACT

A cooling apparatus for electronic drawers utilizing a passive fluid cooling loop in conjunction with an air cooled drawer cover. The air cooled cover provides an increased surface area from which to transfer heat to cooling air flowing through the drawer. The increased cooling surface uses available space within the drawer, which may be other than immediately adjacent to a high power device within the drawer. The passive fluid cooling loop provides heat transfer from the high power device to the air cooled cover assembly, allowing placement of the air cooled cover assembly other than immediately adjacent to the high power device. The cooling apparatus is easily disengaged from the electronics drawer, providing access to devices within the drawer.

22 Claims, 12 Drawing Sheets

COOLING ASSEMBLY FOR ELECTRONICS DRAWER USING PASSIVE FLUID LOOP AND AIR-COOLED COVER

FIELD OF THE INVENTION

The present invention relates in general to cooling electronics systems. In particular, the present invention relates to enhanced cooling of one or more high power electronic components within an air cooled electronics drawer.

BACKGROUND OF THE INVENTION

As is known, operating electronic devices produce heat. This heat should be removed from the devices in order to maintain device junction temperatures within desirable limits: failure to remove the heat thus produced results in increased device temperatures, potentially leading to thermal runaway conditions. Several trends in the electronics industry have combined to increase the importance of thermal management, including heat removal for electronic devices, including technologies where thermal management has traditionally been less of a concern, such as CMOS. In particular, the need for faster and more densely packed circuits has had a direct impact on the importance of thermal management. First, power dissipation, and therefore heat production, increases as the device operating frequencies increase. Second, increased operating frequencies may be possible at lower device junction temperatures. Finally, as more and more devices are packed onto a single chip, power density (Watts/cm$^2$) increases, resulting in the need to remove more power from a given size chip or module. These trends have combined to create applications where it is no longer desirable to remove the heat from modern devices solely by traditional air cooling methods, such as by using traditional air cooled heat sinks.

While alternatives to air cooling are known, such as chilled water and refrigeration systems, these alternatives tend to increase both manufacturing and operational costs, and therefore tend to be applied primarily in high performance applications. Methods are therefore desirable which augment traditional air cooling methods, thereby overcoming at least some of the limitations of traditional methods, without introducing costly refrigeration or chilled water distribution systems.

In general, enhanced air cooling may be achieved by modifying any of a number of parameters, such as ambient air temperature, airflow rate, heatsink surface area, etc. While an increase in any of these factors tends to improve the efficiency with which heat transfers from heatsink fins to ambient air, design considerations may place practical limitations on the extent to which any parameter may be increased, and interactions between the various parameters may limit the effectiveness of a particular parameter change. For example, ambient air temperatures are typically controlled by customer environmental systems, within established limits. Electronic systems are designed to operate within existing customer installations, and typically do not have the flexibility to require reduced ambient air temperatures. Furthermore, many electronic applications are constrained to occupy a limited volume or footprint (i.e. floor surface area). Increases in fin surface area, therefore, are likely accomplished by decreasing fin thickness and increasing fin density, effectively increasing fin surface area within a constant heatsink volume. As fin density thus increases, however, so does the pressure differential between airflow entering the fins and airflow leaving the fins. Both airflow rates and pressure drops are frequently limited by other design considerations, such as acoustic constraints.

Many modern electronic systems are designed in a rack configuration, such as prior art rack 110 illustrated in FIGS. 1A and 1B. Typical electronic rack systems such as rack 110 include several electronics drawers 120, also illustrated in FIG. 2. Each drawer 120 may include an entire electronics subsystem. Air cooling of electronics within drawers 120 is accomplished by using an air moving device mounted within each drawer, such as fan 129, to create an airflow within the drawer. As illustrated in FIGS. 1A, 1B, and 2, fan 129 causes ambient air to enter each drawer 120 through air inlet 127*a* in drawer front 126, flow over devices 138 and heatsink 136 within each drawer, and exit the rear of each drawer through air outlet 127*b* in drawer back 128.

Volume constraints are particularly critical in modern electronic rack systems such as rack 110, having several drawers 120 each containing electronic subsystems. Each drawer 120 is constrained to fit within a relatively small volume. High power components within these drawers, such as processor module 132, typically have a limited volume of space immediately adjacent to the component within which to place a heatsink, such as heatsink 136. The drawer volume constraints therefore place a design limitation on the maximum size heatsink that can be directly attached to a high power device. This places a practical limitation on the extent to which high power devices such as processor 132 may be air cooled within a limited volume drawer.

Electronics drawers typically utilize only a portion of the volume within the drawer, as illustrated in FIG. 2. The available volume may not be conveniently located adjacent to a high power device, however, such as processor 132, and therefore may not provide a volume into which a traditional heat sink directly attached to a high power device may be extended.

For the foregoing reasons, therefore, there is a need in the art for an apparatus capable of utilizing the available unused volume within an electronics drawer to provide enhanced air cooling of high power electronic components within the drawer.

SUMMARY

The shortcomings of the prior art are overcome, and further advantages realized, by the provision of a passive liquid cooling loop and air cooled cover assembly for an electronics drawer, per the teachings of the present invention. The air cooled cover assembly provides an increased surface area from which to transfer heat to air flowing through the drawer, by utilizing available space within a drawer. The passive liquid cooling loop provides heat transfer from a high power device to the air cooled cover assembly, allowing placement of the air cooled cover assembly other than immediately adjacent to the high power device.

In one aspect, the present invention involves a cooling apparatus including a high thermal conductivity electronics drawer cover, a plurality of high thermal conductivity cooling fins in thermal contact with an underside of the cover, a fluid cooling loop, and a mechanical biasing component. The fluid cooling loop includes a plurality of high heat transfer fluid channels in thermal contact with the cover underside and located in proximity to the cooling fins, a flexible vapor conduit, one end of which is in fluid flow communication with a first end of the fluid channels, a high heat transfer boiling chamber in fluid flow communication with a second end of the vapor conduit, and at least one flexible condensate return conduit in fluid flow communication with a second end of the fluid channels and further in fluid flow communication with the boiling chamber. The mechanical biasing component is in mechanical contact with the cover underside and an upper side of the boiling chamber.

In another aspect, the present invention involves a cooled electronic drawer, including a drawer frame having a bottom, side components, a front air inlet component, and a rear air outlet component, an electronics board assembly connected to the drawer frame, the board assembly including a plurality of electronic components, at least one of which is a high power component. The drawer further includes at least one air moving device connected to the drawer frame, and a cooling assembly disengagably connected to the drawer frame. The cooling assembly includes a high thermal conductivity drawer cover, a plurality of high thermal conductivity cooling fins in thermal contact with an underside of the cover, a fluid cooling loop, and a mechanical biasing component. The fluid cooling loop includes a plurality of high heat transfer fluid channels in thermal contact with the cover underside and located in proximity to the cooling fins, a flexible vapor conduit, one end of which is in fluid flow communication with a first end of the fluid channels, a high heat transfer boiling chamber in fluid flow communication with a second end of the vapor conduit, and at least one flexible condensate return conduit in fluid flow communication with a second end of the fluid channels and further in fluid flow communication with the boiling chamber. The mechanical biasing component is in mechanical contact with the cover underside and an upper side of the boiling chamber, placing the boiling chamber in thermal contact with the at least one high power component when the cover is in a closed position.

In a further aspect, the present invention involves a cooled electronic rack system including a rack frame, and at least one electronic drawer slidably mounted within the frame. The drawer includes a drawer frame having a bottom, side components, a front air inlet component, and a rear air outlet component, an electronics board assembly connected to the drawer frame, the board assembly including a plurality of electronic components, at least one of which is a high power component. The drawer further includes at least one air moving device connected to the drawer frame, and a cooling assembly disengagably connected to the drawer frame. The cooling assembly includes a high thermal conductivity drawer cover, a plurality of high thermal conductivity cooling fins in thermal contact with an underside of the cover, a fluid cooling loop, and a mechanical biasing component. The fluid cooling loop includes a plurality of high heat transfer fluid channels in thermal contact with the cover underside and located in proximity to the cooling fins, a flexible vapor conduit, one end of which is in fluid flow communication with a first end of the fluid channels, a high heat transfer boiling chamber in fluid flow communication with a second end of the vapor conduit, and at least one flexible condensate return conduit in fluid flow communication with a second end of the fluid channels and further in fluid flow communication with the boiling chamber. The mechanical biasing component is in mechanical contact with the cover underside and an upper side of the boiling chamber, placing the boiling chamber in thermal contact with the at least one high power component when the cover is in a closed position.

It is therefore an object of the present invention to provide enhanced air cooling of high power devices within an electronics drawer, by transferring heat from the high power device to an extended surface area in thermal contact with a high thermal conductivity drawer cover.

It is a further object of the present invention to provide a passive fluid cooling loop to conduct heat from a high power device within an electronics drawer to an extended surface area in thermal contact with a high thermal conductivity drawer cover.

It is a further object of the present invention to provide an electronics drawer cover with extended heat transfer surfaces and a passive fluid cooling loop in a disengagable unit, thereby facilitating access to drawer components for service, repair, replacement, etc., as well as field upgrades of existing electronics drawers.

The recitation herein of a list of desirable objects which are met by various embodiments of the present invention is not meant to imply or suggest that any or all of these objects are present as essential features, either individually or collectively, in the most general embodiment of the present invention or in any of its more specific embodiments.

BRIEF DESCRIPTION OF THE DRAWINGS

The subject matter which is regarded as the invention is particularly pointed out and distinctly claimed in the concluding portion of the specification. The invention, however, both as to organization and method of practice, together with further objects and advantages thereof, may best be understood by reference to the following description taken in connection with the accompanying drawings in which:

DETAILED DESCRIPTION OF THE INVENTION

In accordance with preferred embodiments of the present invention, a passive liquid cooling loop and air cooled cover assembly for an electronics drawer is disclosed herein.

Figure 1A:
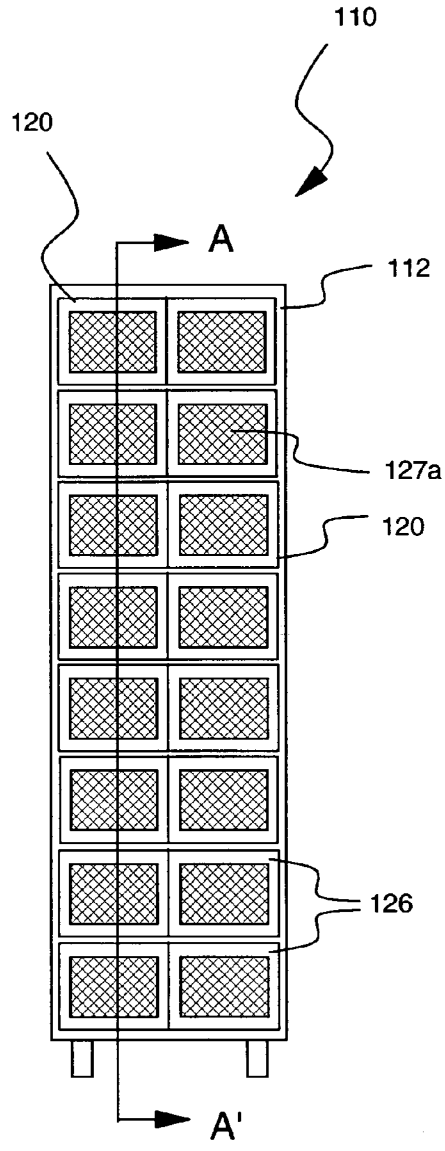
FIG. 1A illustrates a front view of a prior art electronics rack system, having a plurality of electronic drawers.
Figure 1B:
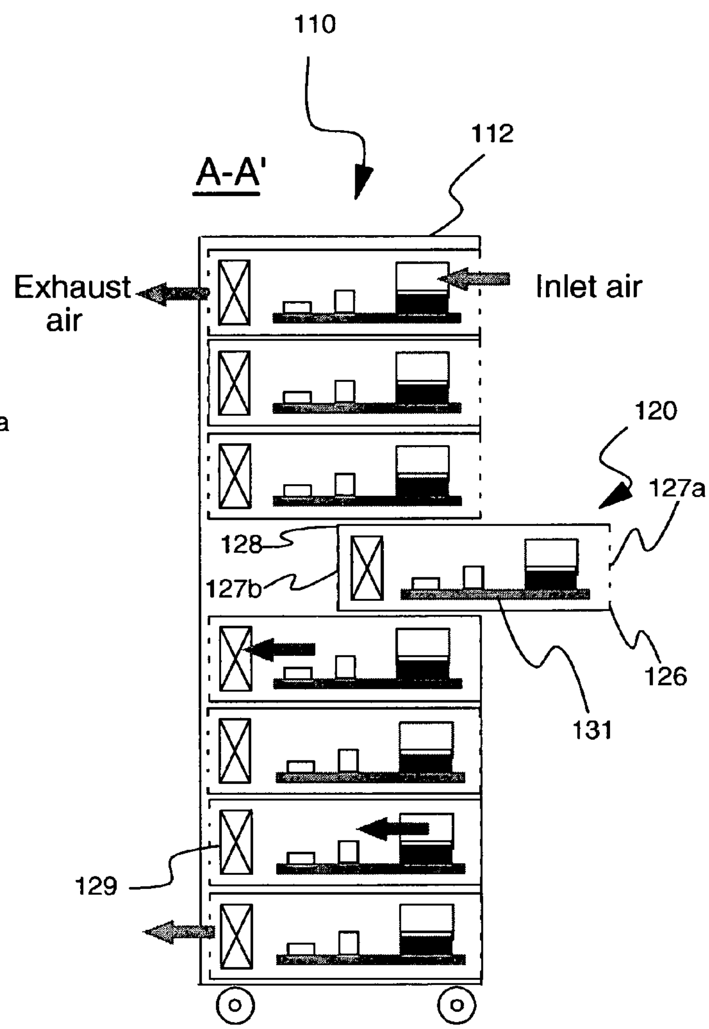
FIG. 1B illustrates a cross section of the rack system illustrated in FIG. 1A, taken along line A–A'.

FIGS. 1A and 1B illustrate prior art electronics rack assembly 110. FIG. 1A depicts a front view, showing a two-column array of electronics drawers 120 arranged within rack frame 112. Rack frame 112 provides mechanical support for the array of drawers 120: drawers 120 are preferably mounted within rack frame 112 such that each drawer is capable of being slid forward without disturbing other drawers 120, as illustrated in FIG. 1B. Each drawer includes a front panel 126 having air inlet 127*a*, through which ambient air enters each drawer 120. FIG. 1B depicts a cross section of rack 110, taken along line A–A' of FIG. 1A. As illustrated in FIG. 1B, each drawer 120 includes an air moving device, such as fan 129, mounted within drawer 120. Fan 129 causes air to flow from air inlet 127*a* within drawer front 126, through drawer 120 and over components within drawer 120, through fan 129, exiting drawer 120 through air outlet 127*b* in drawer back 128.

Figure 2:
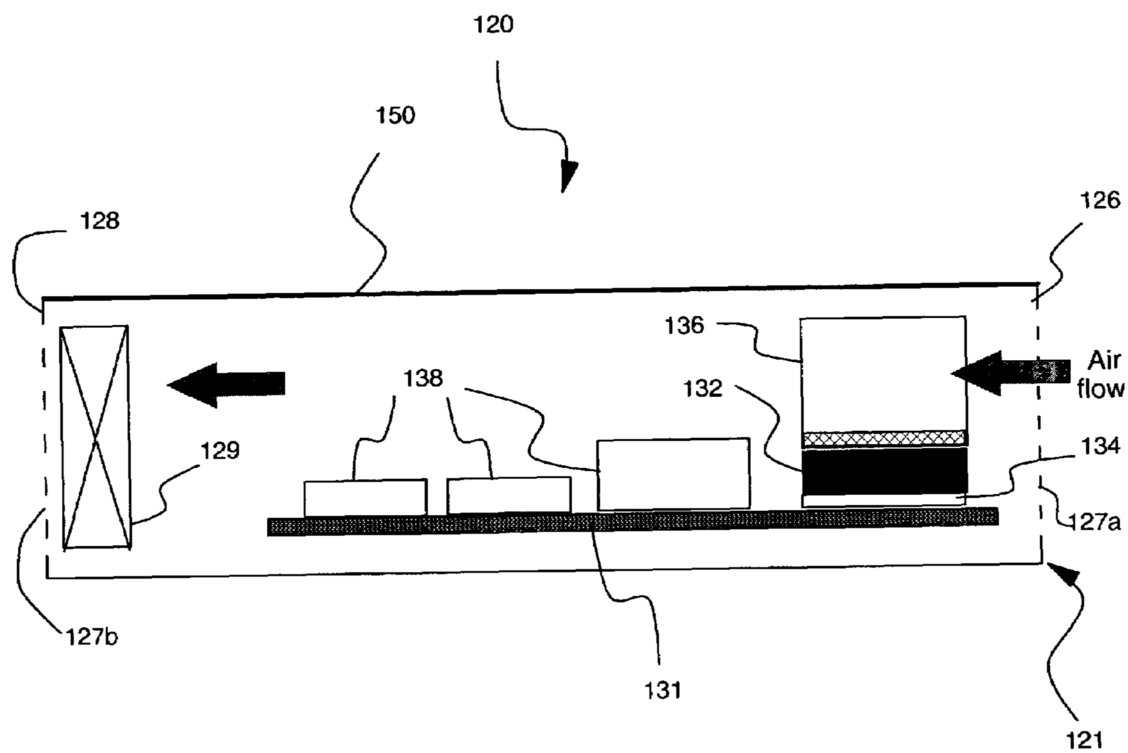
FIG. 2 illustrates an enlarged cross section of a prior art drawer depicted in FIG. 1B.

FIG. 2 illustrates an enlarged cross section of a prior art electronics drawer 120, such as may be used in rack 110. Drawer 120 includes a drawer frame 121, comprised of bottom 122 and several frame components: front 126, back 128, and two sides (not visible in the cross section view of FIG. 2). Frame components 126 and 128 include air permeable grille structures 127*a* and 127*b*, respectively, as illustrated in FIGS. 1A and 1B, allowing air to enter and exit drawer 120. Fan 129 is mounted to frame 121, preferably near back 128. Circuit board 131 is mounted to drawer frame 121, preferably on or near drawer bottom 122. Board 131 provides mechanical and electrical connections to electronic devices, such as devices 138. Electronic drawer 120 also includes at least one high power component, such as processor module 132. Module 132 is connected to board 131 via socket 134. In order to remove heat from high power processor module 132, heatsink 136 is directly attached to an upper surface of module 132. As illustrated, the dimensions of heatsink 136 are constrained by drawer cover 150 in the vertical direction, and by components 138 and drawer front 126 in the horizontal direction. Also as illustrated in FIG. 2, there exists considerable unused space within drawer 120, in the region between devices 138 and cover 150. This unused space is not in a region immediately adjacent to high power module 132, however, and therefore does not provide additional volume into which heatsink 136 may be extended.

Figure 3A:
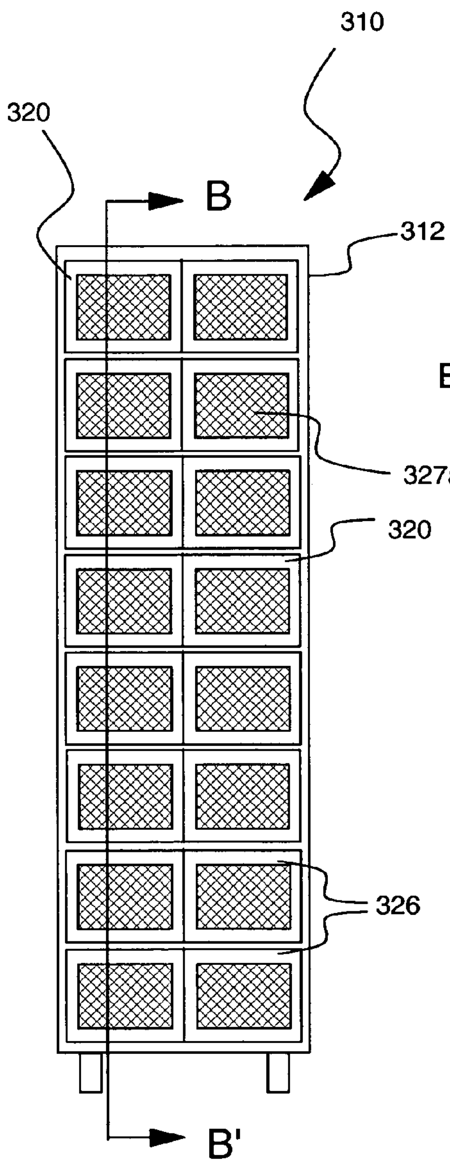
FIG. 3A illustrates a front view of an electronics rack system having a plurality of electronics drawers, per an embodiment of the present invention.
Figure 3B:
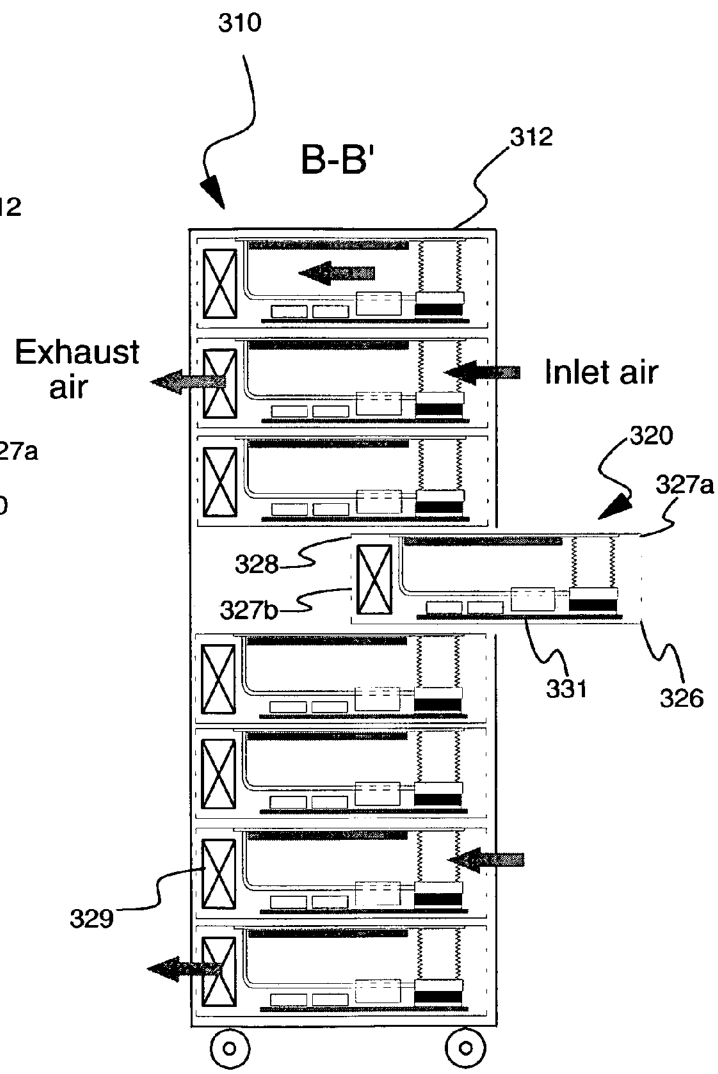
FIG. 3B illustrates a cross section of the rack system depicted in FIG. 3A, taken along line B–B', per an embodiment of the present invention.

FIGS. 3A and 3B illustrate electronics rack assembly 310, per an embodiment of the present invention. FIG. 3A depicts a front view, showing a two-column array of electronics drawers 320 per an embodiment of the present invention, arranged within rack frame 312. Rack frame 312 may be identical to frame 112: therein lies an advantage of the present invention. The cooling enhancement apparatus of the present invention is implemented within drawer 320, without modifying the external dimensions of drawer 320. In preferred embodiments of the present invention, the external dimensions of drawer 320 of the present invention are identical to the external dimensions of prior art drawer 120, thereby allowing drawers 120 and drawers 320 to be used interchangeably in either frame 112 or frame 312. Rack frame 312 provides mechanical support for the array of drawers 320: drawers 320 are preferably mounted within rack frame 312 such that each drawer is capable of being slid forward without disturbing other drawers 320, as illustrated in FIG. 3B. Each drawer includes a front panel 326 having air inlet 327*a*, through which ambient air enters each drawer 320. FIG. 3B depicts a cross section of rack 310, taken along line B–B' of FIG. 3A. As illustrated in FIG. 3B, each drawer 320 includes an air moving device, such as fan 329, mounted within drawer 320. Fan 329 causes air to flow from air inlet 327*a* within drawer front 326, through drawer 320 and over components and associated cooling devices within drawer 320, through fan 329, exiting drawer 320 through air outlet 327*b* in drawer back 328.

Figure 4A:
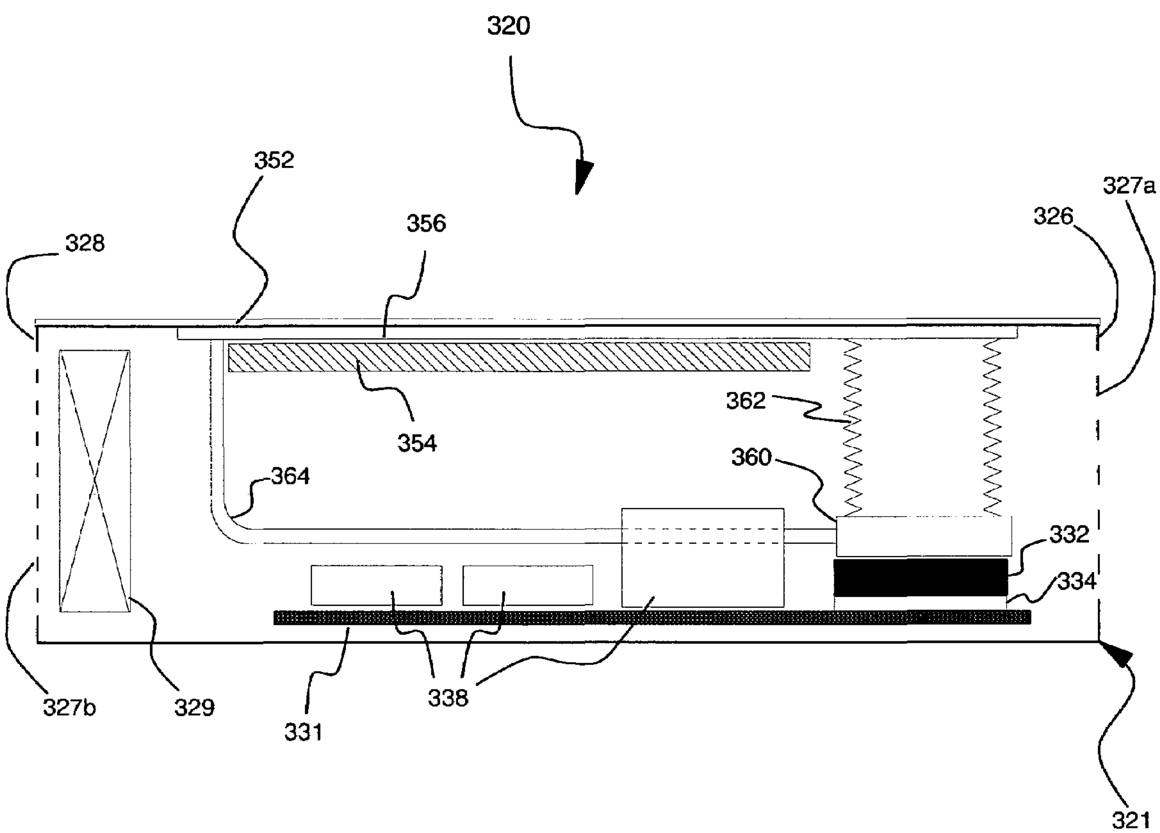
FIG. 4A illustrates an enlarged cross section of an electronics drawer depicted in FIG. 3B, per an embodiment of the present invention.
Figure 4B:
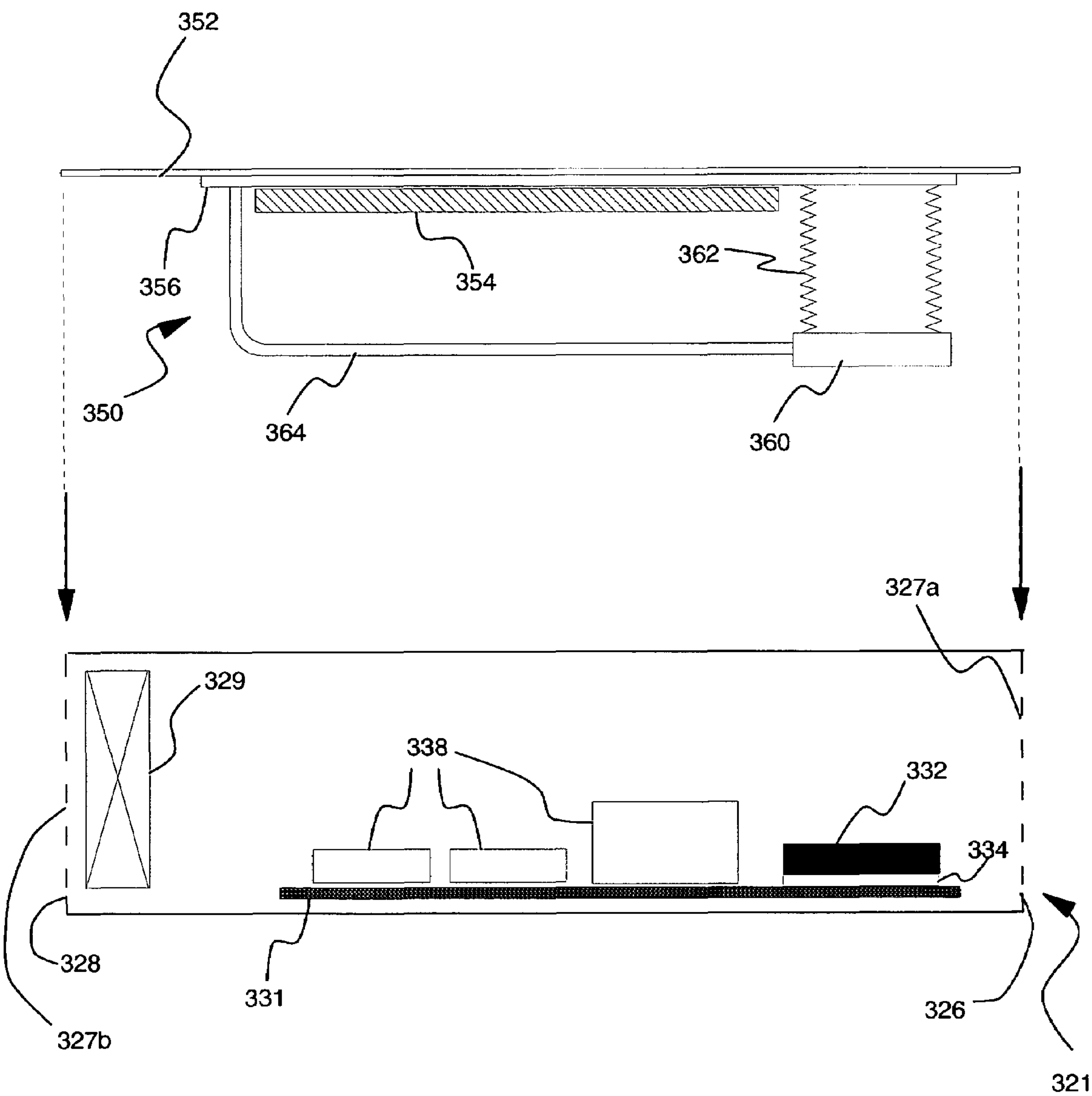
FIG. 4B illustrates an exploded cross section of the drawer depicted in FIG. 4A, per an embodiment of the present invention.

FIGS. 4A and 4B illustrate enlarged cross sections of a drawer 320 depicted in FIG. 3B. FIG. 4A depicts an assembled drawer 320, while FIG. 4B depicts an exploded view of drawer 320 with cover cooling assembly 350 detached from drawer frame 321. As described herein, the primary differences between prior art drawer 120 and drawer 320 of the present invention involve cover cooling assembly 350.

FIG. 4A illustrates an enlarged cross section of an assembled electronics drawer 320 per an embodiment of the present invention. Drawer 320 includes drawer frame 321, comprised of bottom 322 and several frame components: front 326, back 328, and two sides 324 (not shown in FIG. 4A). Sides 324, while not illustrated in the cross section view of FIG. 4A, are identical to sides 724 (724*a*, 724*b*) illustrated in the embodiment depicted in FIGS. 6A and 6B. Frame components 326 and 328 include air permeable grille structures 327*a* and 327*b*, respectively, as illustrated in FIGS. 3A and 3B, allowing air to enter and exit drawer 320. Fan 329 is mounted to frame 321, preferably near back 328. Circuit board 331 is mounted to drawer frame 321, preferably on or near drawer bottom 322. Board 331 provides mechanical and electrical connections to electronic devices, such as devices 338. Electronic drawer 320 also includes a high power component, such as processor module 332. Module 332 is connected to board 331 via socket 334. Unlike module 132 within drawer 120, no heatsink is attached to module 332. Elimination of heatsink 136 is the only substantial difference between the lower portion of prior art drawer 120 and the lower portion of drawer 320 of the present invention, where the lower portions of drawers 120 and 320 include frames 121 and 321, boards 131 and 331 and components attached thereto, and fans 129 and 329, respectively.

FIG. 4B illustrates an exploded view of drawer 320 per an embodiment of the present invention, where cover cooling assembly 350 is detached from drawer frame 321. As previously discussed, the lower portion of prior art drawer 120 differs from the lower portion of drawer 320 of the present invention only in the absence of a heatsink in contact with module 332 of drawer 320. Within drawer 320 of the present invention, cooling assembly 350 removes heat from high power module 332.

As illustrated in FIG. 4B, cooling assembly 350 is preferably a self-contained cooling unit, completely detachable from drawer frame 321. Alternatively, and as discussed herein with respect to FIG. 9, cooling assembly 350 is disengagable from high power component 332 and all but one drawer frame component, but not completely detachable from drawer frame 321, such as when assembly 350 is connected to one component of frame 321 by a permanent hinge. As described herein, cooling assembly 350 is disengagable, or preferably fully detachable, from drawer frame 321 without disturbing the closed fluid loop within assembly 350.

Figure 5C:
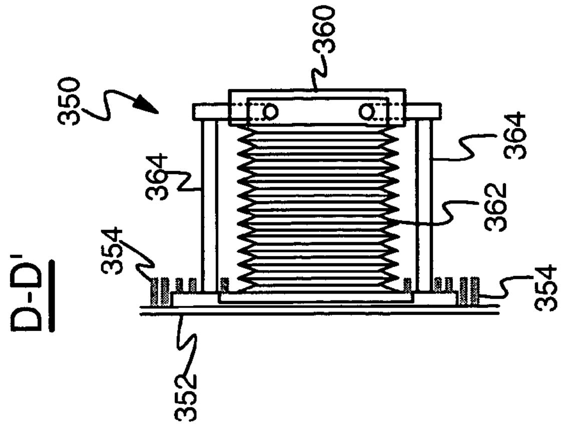
FIG. 5C illustrates a cross section of the cover assembly depicted in FIG. 5A, taken along line D–D', per an embodiment of the present invention.
Figure 5B:
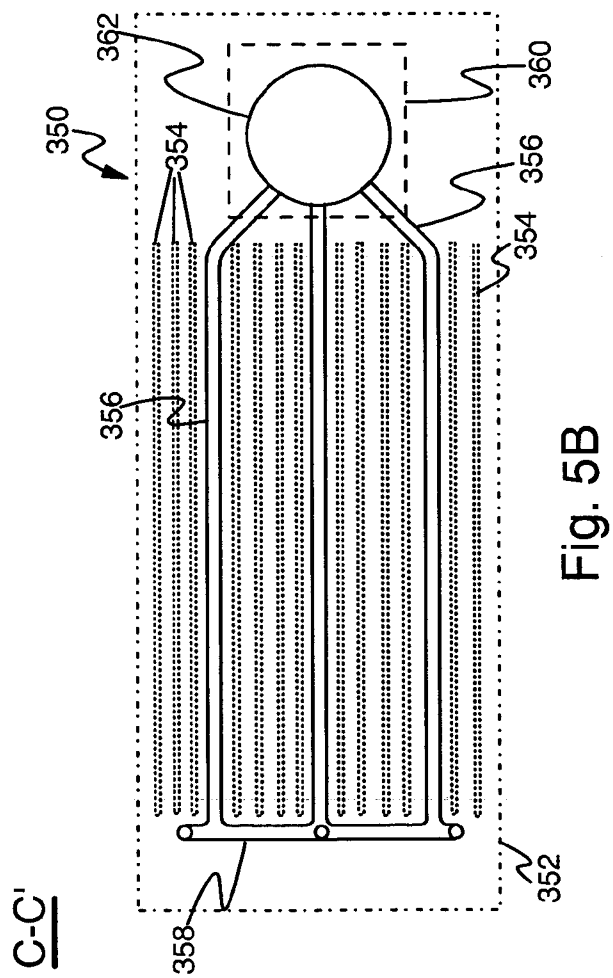
FIG. 5B illustrates a cross section of the cover assembly depicted in FIG. 5A, taken along line C–C', per an embodiment of the present invention.
Figure 5A:
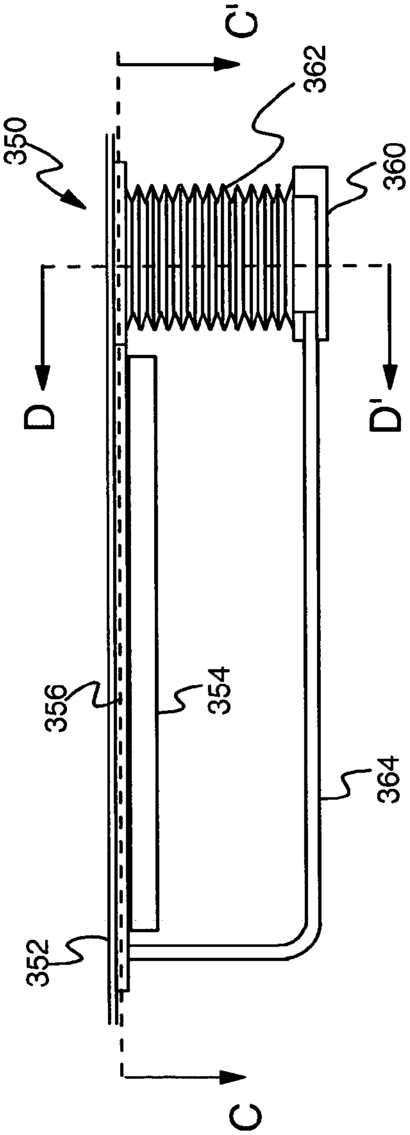
FIG. 5A illustrates a side view of a cover assembly with passive liquid cooling loop, per an embodiment of the present invention.

With reference to FIGS. 4B, 5A, 5B, and 5C, the structure and components of cooling assembly 350 are now described. FIG. 5A illustrates a side view of cooling assembly 350, per an embodiment of the present invention. FIG. 5B is a cross section of assembly 350, taken at C–C' of FIG. 5A. FIG. 5B therefore depicts a view of components attached to the underside of cover 352. FIG. 5C is a cross section of assembly 350, taken at D–D' of FIG. 5A. Cooling assembly 350 includes high thermal conductivity cover 352. In addition to the functions provided by prior art cover 152, cover 352 is an integral part of cooling assembly 350. Cover 352 provides mechanical support for assembly 350. Cover 352 also provides a high thermal conductivity pathway between two components of assembly 350: cooling fins 354, and fluid/vapor channels 356. As illustrated in FIG. 5B, a plurality of cooling fins 354 are attached to the underside of cover 352. Fins 354 are oriented parallel to the direction of airflow through drawer 320, i.e., front to back. Also illustrated in FIG. 5B are a set of fluid/vapor channels 356, also attached to the underside of cover 352. Both sets of components, fins 354 and channels 356, are attached to cover 352 in a manner that provides a low thermal resistance path between each set of components and cover 352, throughout the length of each set of components, thus facilitating heat transfer from channels 356 to fins 354. In preferred embodiments of the present invention, fins 354 are located in proximity to channels 356, to improve the thermal path therebetween. Also, in preferred embodiments of the present invention, and as illustrated in FIG. 5B, channels 356 are interdigitated with fins 354.

In preferred embodiments of the present invention, cover 352 is made from a rigid, high thermal conductivity material such as aluminum. Other materials may be used to construct cover 352 such as copper, nickel, stainless steel, etc., however aluminum provides an additional advantage in providing a relatively light weight cover 352. Fins 354 are preferably formed of a material having high thermal conductivity: in preferred embodiments of the present invention, fins 354 are composed of a material similar to that of cover 352, such as aluminum, copper, nickel, stainless steel, etc. An assembly of cover and fins is formed either by milling or otherwise machining fins 354 from a single structure, or by attaching fins 354 to a separate cover 352 such as by soldering, brazing, or other methods of forming a permanent, high heat transfer bond as known in the art. In preferred embodiments of the present invention, channels 356 are composed of a material having high thermal conductivity, and which is chemically compatible with a cooling fluid selected for use within assembly 350. Preferred embodiments of the present invention employ channels 356 formed of copper or stainless steel, however other materials such as aluminum, nickel, etc. may be used to construct channels 356. Channels 356 are attached to cover 352 by soldering, brazing, welding, or other methods of forming a permanent, high heat transfer bond as known in the art.

Figure 11A:
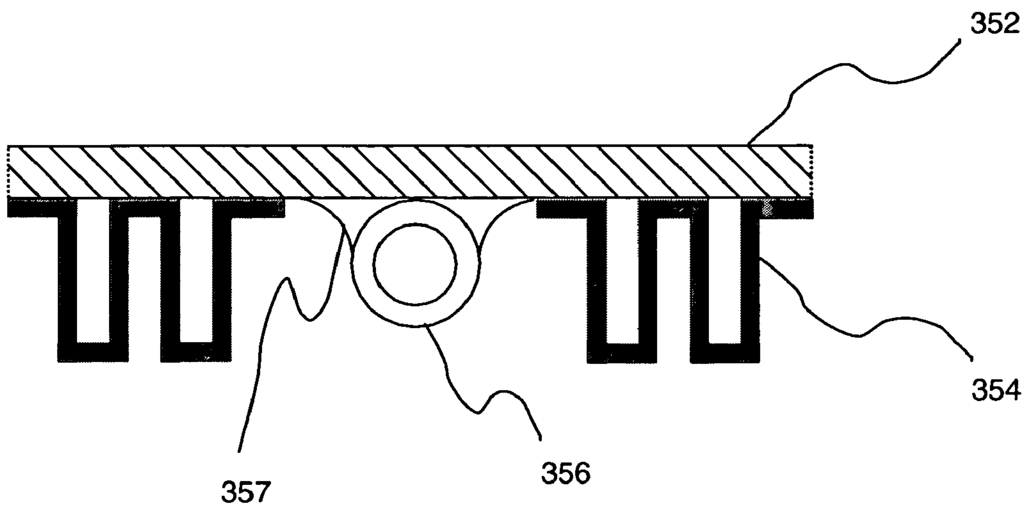
Figure 11B:
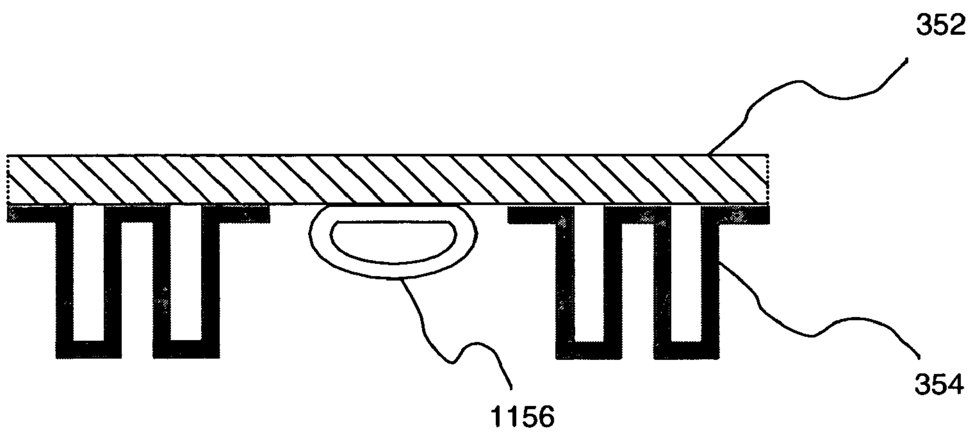
Figure 11C:
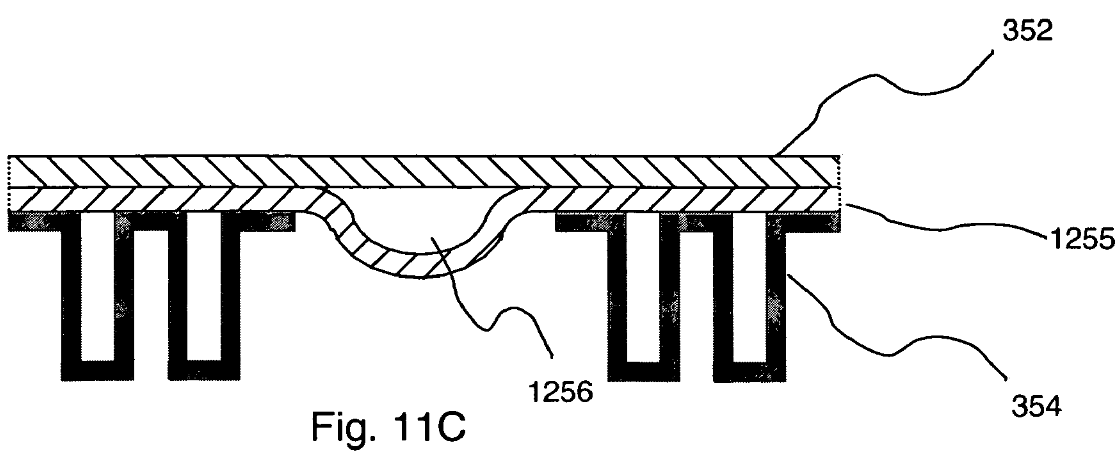

FIGS. 11A, 11B, and 11C illustrate cross sectional views of a variety of constructions for a cover, fin, and channel assembly of preferred embodiments of the present invention. FIG. 11A depicts a circular cross section channel 356, joined to cover 352 by solder 357. Using a channel having circular cross section, such as channel 356 of FIG. 11A, results in minimal thermal joint contact area between channel 356 and the underside of cover 352. Solder 357 improves thermal performance by increasing the effective thermal joint contact area available for thermal conduction between channel 356 and cover 352. Fins 354 are joined to cover 352 using a high thermal conductivity bond as known in the art, such as any metallurgical joint, thermal epoxy, etc. Any of the materials previously listed for each component are usable in the embodiment of FIG. 1A, however in preferred embodiments of the present invention, a structure such as FIG. 11A is constructed using copper or aluminum for cover 352 and fins 354, while channel 356 is preferably formed of copper or stainless steel.

FIG. 11B depicts an alternative channel 1156, having a flattened cross section. The flattened cross section of channel 1156 increases the thermal joint contact area between channel 1156 and cover 352, thereby improving thermal performance. Channel 1156 is preferably joined to cover 352 using a high thermal conductivity bond as known in the art, such as any metallurgical joint (such as a joint formed by brazing, welding, soldering, etc.), thermal epoxy, etc. Fins 354 are joined to cover 352 using a high thermal conductivity bond as known in the art, such as any metallurgical joint, thermal epoxy, etc. Any of the materials previously listed for each component are usable in the embodiment of FIG. 11B, however in preferred embodiments of the present invention, a structure such as FIG. 11B is constructed using copper or aluminum for cover 352 and fins 354, while channel 356 is preferably formed of copper or stainless steel.

FIG. 11C depicts yet another alternative channel 1256. Channel 1256 is formed by a two plate sandwich structure: cover 352 provides the upper plate, plate 1255 the lower plate. As depicted in FIG. 11C, plate 1255 is substantially planar in the regions of fins 354, and is bowed away from cover 352 in the region between fins 354, thus forming channel 1256 between cover 352 and plate 1255, in the region between fins 354. Plate 1255 is joined to cover 352 in a manner capable of producing a hermetic seal; in preferred embodiments of the present invention, plate 1255 is joined to cover 352 by brazing or soldering. Also, in preferred embodiments of the present invention using a two-plate channel structure such as the structure depicted in FIG. 11C, cover 352 and plate 1255 are both formed of copper. Any of the materials previously described with respect to fins 354 are usable for fins 354 in the embodiment of FIG. 11C, however in preferred embodiments fins 354 are formed of copper or aluminum. Fins 354 are joined to plate 1255 using a high thermal conductivity bond as known in the art, such as any metallurgical joint, thermal epoxy, etc.

As illustrated in FIGS. 4B, 5A, 5B, and 5C, cooling assembly 350 includes a closed fluid loop comprised of four primary components: fluid channels 356, attached to cover 352 as previously described; flexible vapor conduit 362 in fluid flow communication with channels 356 and in mechanical contact with cover 352; boiling chamber 360 in fluid flow communication and mechanical contact with conduit 362; and fluid return conduit 364 in fluid flow communication with boiling chamber 360 and channels 356.

Boiling chamber 360 provides a high heat transfer path between high power component 332 and a cooling fluid within boiling chamber 360. Toward this end, an external lower surface of boiling chamber 360 is in thermal and mechanical contact with an upper surface of component 332 when cover assembly 350 is attached to drawer frame 321 and in a fully closed position, as illustrated in FIG. 4A. Boiling chamber 360 includes an internal chamber within which a cooling fluid is heated to boiling. Boiling chamber 360 is constructed of a rigid, high thermal conductivity metal: preferred embodiments utilize metals such as copper, aluminum, stainless steel, or nickel. Boiling chamber 360 is constructed having width and depth substantially the same as an upper surface of high power component 332, and with a substantially planar lower surface for making thermal contact with high power component 332.

Flexible conduit 362 provides a hermetic fluid flow path between boiling chamber 360 and fluid/vapor channels 356. In general, conduit 362 is formed of a material that is chemically compatible with a cooling fluid selected for use within assembly 350. Conduit 362 should be sufficiently flexible to maintain fluid connections between boiling chamber 360 and channels 356 when assembly 350 is detached from frame 321, such as illustrated in FIG. 4B, and when assembly 350 is attached to frame 321 and in a fully closed position, such as illustrated in FIG. 4A. As discussed below, this flexibility is required in order to insure good thermal contact between a lower surface of boiling chamber 360 and an upper surface of high power component 332. In preferred embodiments of the present invention, conduit 362 is a metallic bellows structure, formed of materials such as copper, stainless steel, aluminum, nickel, or the like. Also, in preferred embodiments of the present invention utilizing a cooling fluid at subatmospheric pressure, conduit 362 should be sufficiently rigid to prevent collapsing due to the resulting pressure differential: conduit 362 is thus preferably formed of a material having a sufficiently high Young's modulus, such as that exhibited by copper, stainless steel, aluminum, nickel, etc. In preferred embodiments, this combination of longitudinal flexibility and sidewall rigidity is achieved by utilizing a folded, bellows structure for the walls of conduit 362.

To maintain good thermal contact between boiling chamber 360 and high power component 332, assembly 350 provides a compressive force between boiling chamber 360 and high power component 332 when assembly 350 is attached to frame 321 and in a fully closed position, as illustrated in FIG. 4A. Assembly 350 provides this compressive force by including a mechanical biasing component between a lower surface of cover 350 and an upper surface of boiling chamber 360. The biasing component should have a sufficient spring constant to maintain adequate compressive force between boiling chamber 360 and high power component 332 when assembly 350 is attached and fully seated against drawer frame 321. When assembly 350 is detached (FIG. 4B) or pivoted open (FIG. 9), the mechanical biasing component causes boiling chamber 360 to deflect away from cover 352 (deflection not illustrated). When assembly 350 is attached to frame 321, boiling chamber 360 contacts an upper surface of component 332 before assembly 350 is fully seated against all upper frame components (i.e., sides 324 (or 724, see FIG. 6), front 326, and back 328). As assembly 350 is brought into a fully closed or fully seated position against frame 321, as illustrated in FIG. 4A, the mechanical biasing component is compressed between boiling chamber 360 and cover 352, creating a compressive force between a lower surface of boiling chamber 360 and an upper surface of component 332. Preferred embodiments of the present invention utilize a mechanical biasing component having a spring constant in the range of 20–200 pounds per inch, and boiling chamber 360 deflects over a range of approximately 1 inch, +/−approximately 10%. Other arrangements involving different deflections and/or spring constants are also usable, within the spirit and scope of the present invention. In preferred embodiments of the present invention, conduit 362 is also a mechanical biasing component: the metallic bellows conduit 362 of preferred embodiments is sufficiently flexible to maintain fluid contact throughout the range of deflection (fully open to fully closed cover assembly 350), and further exhibits a sufficient spring constant to create the compressive force needed to maintain good thermal contact between boiling chamber 360 and component 332. In alternative embodiments of the present invention, such as the embodiment illustrated in FIG. 10, a separate mechanical biasing component 1063 is added between boiling chamber 1060 and cover 1052, such as a spring, surrounding conduit 1062.

As previously noted, conduit 362 provides a hermetic fluid path between boiling chamber 360 and channels 356. As illustrated in FIG. 5B, preferred embodiments of the present invention utilize a plurality of channels 356 to improve heat transfer to cover 352: more or fewer channels may be used, however, within the spirit and scope of the present invention. In preferred embodiments of the present invention, each of the plurality of channels 356 connects directly to conduit 362: conduit 362 therefore acts as an input plenum to the plurality of channels 356.

Channels 356 direct fluid from conduit 362 to one or more return conduits 364. As illustrated in FIG. 5C, preferred embodiments of the present invention utilize two return conduits 364; more or fewer conduits may be used, however, within the spirit and scope of the present invention. In preferred embodiments of the present invention, channels 356 are connected to outlet plenum 358, which in turn is connected to return conduits 364. Also, in preferred embodiments of the present invention, channels 356 are optionally pitched to promote fluid flow into return conduits 364.

Return conduits 364 provide a mechanically flexible path for fluid condensed in channels 356 to return to boiling chamber 360. As previously noted, in order to maintain good thermal contact between high power component 332 and boiling chamber 360, cooling assembly 350 includes a mechanical biasing component in mechanical contact with boiling chamber 360 and cover 352. This biasing component results in a range of deflection between boiling chamber 360 and cover 352 when assembly 350 is engaged with or disengaged from frame 321 (deflection not illustrated in Figures). Return conduits 364 must therefore maintain a hermetic fluid path throughout the range of deflection of boiling chamber 360. In preferred embodiments of the present invention utilizing a cooling fluid at subatmospheric pressure, return conduits 364 must also exhibit sufficient rigidity to resist collapsing under the resulting pressure differential. Return conduits 364 are therefore preferably formed of a material having sufficient flexibility throughout, such as copper, aluminum, nickel, or the like, such as illustrated in FIGS. 4 and 5.

Figures 7A, 7B, 7C:
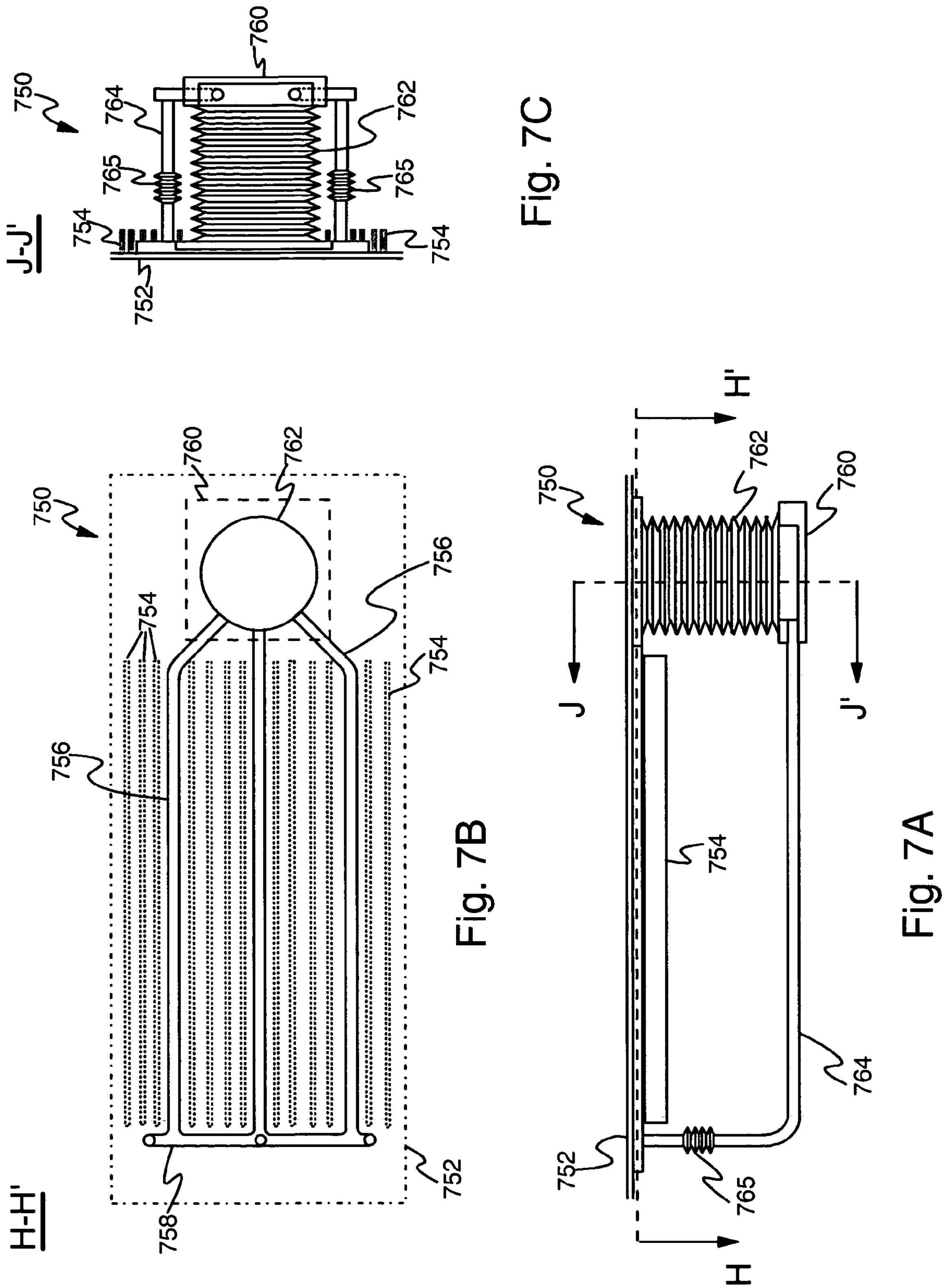
FIG. 7A illustrates a side view of a cover assembly with passive liquid cooling loop including a return bellows, per an embodiment of the present invention.
FIG. 7B illustrates a cross section of the cover assembly depicted in FIG. 7A, taken along line H–H', per an embodiment of the present invention.
FIG. 7C illustrates a cross section of the cover assembly depicted in FIG. 7A, taken along line J–J', per an embodiment of the present invention.

Alternatively, return conduits 764, illustrated in assembly 750 of FIGS. 7A, 7B, and 7C, are composed of rigid material such as stainless steel. Since the primary portions of conduits 764 lack sufficient flexibility to maintain a hermetic fluid path throughout the range of deflection of boiling chamber 360, conduits 764 include at least one flexible bellows 765 in each return conduit. Flexible bellows 765 provides the flexibility required to maintain fluid communication throughout the range of deflection of boiling chamber 360, when conduits 764 are composed of materials lacking sufficient flexibility. As previously noted with respect to conduits 364 and flexible bellows 362, a bellows structure provides sufficient flexibility while maintaining sufficient sidewall rigidity to resist collapse due to a pressure differential when using a cooling fluid at subatmospheric pressure. Return conduits 764 with bellows 765 are formed in a variety of ways, as known in the art. For example, in one embodiment of the present invention, conduits 764 are formed of three sections: an upper rigid section, bellows 765, and a lower rigid section, where the three sections are joined by brazing, welding, etc. Alternatively, conduits 764 are formed of a single section of rigid tubing, a portion of which is collapsed in the longitudinal direction to form bellows 765. Assembly 750 of FIG. 7 is otherwise identical to assembly 350 illustrated in FIGS. 4 and 5.

While the fluid loop components (channels 356, conduit 362, boiling chamber 360, and return conduits 364) may be formed from a variety of materials, in preferred embodiments of the present invention the same material is used for all components. Alternatively, different materials may be used for various components, provided that the materials are chemically compatible with each other and with a selected cooling fluid, and further provided that the materials enable formation of a hermetic joint when fluid loop components are joined. In preferred embodiments of the present invention, fluid loop components are joined by brazing, welding, or other methods known in the art capable of providing a hermetic seal.

Figure 8:
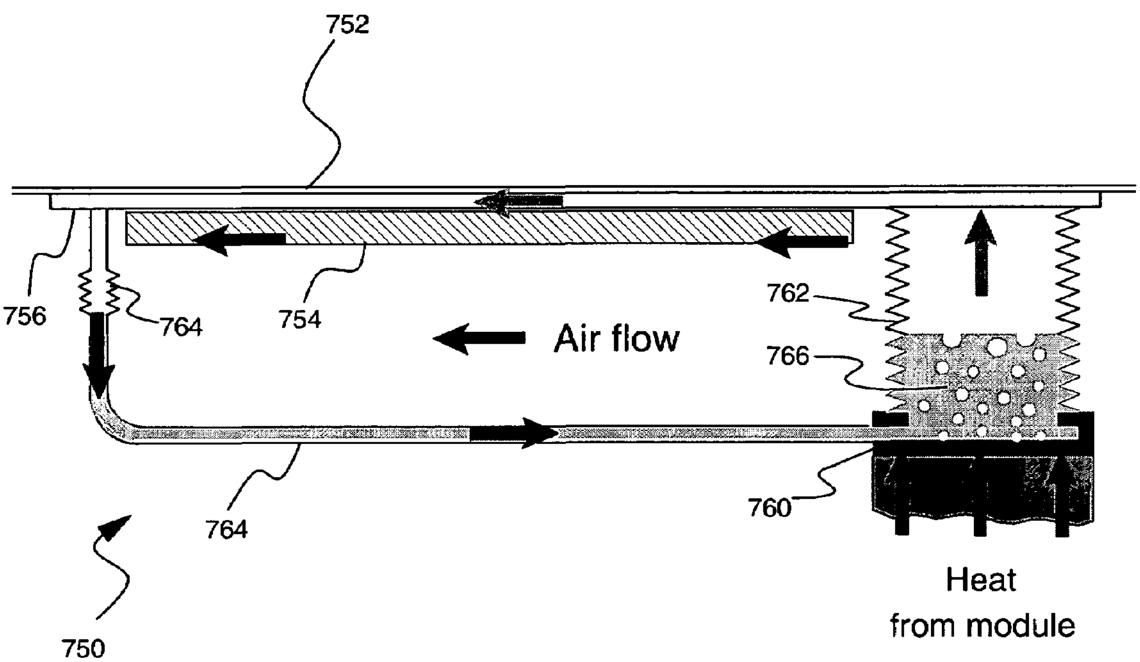
FIG. 8 illustrates a schematic view of a passive cooling loop of an embodiment of the present invention in operation.

With reference now to the schematic drawing illustrated in FIG. 8, the operation of assembly 750 is now described. FIG. 8 illustrates boiling chamber 760 in thermal and mechanical contact with an upper surface of component 732, as is the case when assembly 750 is fully seated against all drawer frame components (not shown), such as the orientation illustrated in FIG. 4A. In this configuration, heat flows from high power component 732 to boiling chamber 760. To improve heat transfer, the lower wall of boiling chamber 760 should be only as thick as necessary to provide mechanical rigidity: in preferred embodiments of the present invention, the lower wall of boiling chamber 760 is in the range of approximately 2 mm to 5 mm thick. Boiling chambers 760 having thicker or thinner lower walls may be used, however, within the spirit and scope of the present invention. Boiling chambers 760 having lower walls thinner than about 2 mm may require internal mechanical stiffeners, as known in the art.

Boiling chamber 760 and a portion of conduit 762 are filled with cooling fluid 766. Cooling fluid 766 should be chemically compatible with the materials selected for the fluid loop components (channels 756, conduit 762, boiling chamber 760, and return conduits 764), in order to avoid corrosion or other undesirable chemical interactions between fluid 766 and fluid loop components. Also, cooling fluid 766 should exhibit a high latent heat of vaporization, and high thermal conductivity. Finally, in preferred embodiments of the present invention using fluid 766 at subatmospheric pressure, fluid 766 should boil within a desired temperature range (such as, for example, 40C to 60C) when fluid 766 is at a relatively low vapor pressure. In preferred embodiments of the present invention, cooling fluid 766 is water or brine, however fluid 766 also includes fluids such as refrigerants and fluorocarbons, within the spirit of the present invention. As used herein, a brine is any fluid consisting of a salt in aqueous solution, such as a water-glycol solution, or a solution of water and one or more organic salts, for example. Preferred embodiments of the present invention use a brine suitable for low temperature use, such as a low temperature cooling fluid sold under the tradename DYNALENE HC (sold by the Dynalene Company of Whitehall, Pa., (610) 262-9686). Further, in preferred embodiments of the present invention, fluid 766 boils at a temperature below 100C, preferably below 60C, and further preferably within the range of 40C to 60C. Where fluid 766 is water or other aqueous solution, an appropriately low boiling point is achieved by first evacuating air from the fluid loop of assembly 750, then partially backfilling with a quantity of fluid 766, keeping fluid 766 at subatmospheric pressure.

Boiling chamber 760 transfers heat from high power component 732 to fluid 766, causing fluid 766 to boil. Fluid 766, now in vapor phase, rises through liquid phase fluid 766 within boiling chamber 760 and conduit 762, then continues to rise through conduit 762 and then enters channels 756. Vapor phase fluid 766 flows along channels 756, transferring heat to channels 756. As previously noted, channels 756 are in thermal contact with cover 752, which in turn is in thermal contact with fins 754. As air flows over fins 754, heat is transferred from fins 754 to the air, which subsequently removes the heat from cooling assembly 750. As heat is thus transferred from vapor phase fluid 766 to the ambient air, fluid 766 condenses from vapor phase to liquid phase, preferably prior to exiting channels 756 and entering return conduits 764. Conduits 764 then collect condensed fluid 766, and return fluid 766 to boiling chamber 760.

As described above, the fluid cooling loop within assembly 750 causes fluid 766 to undergo two phase changes during each fluid circuit: liquid to vapor within boiling chamber 760, and vapor to liquid within channels 756 and/or return conduits 764. By utilizing phase changes, the present invention provides thermal transfer from high power component 732 to ambient air while minimizing the volume flow of fluid 766. Furthermore, waste heat from component 732 provides the motive force to create fluid flow, therefore eliminating the need for a flow-inducing device such as a mechanical pump.

Figure 6A:
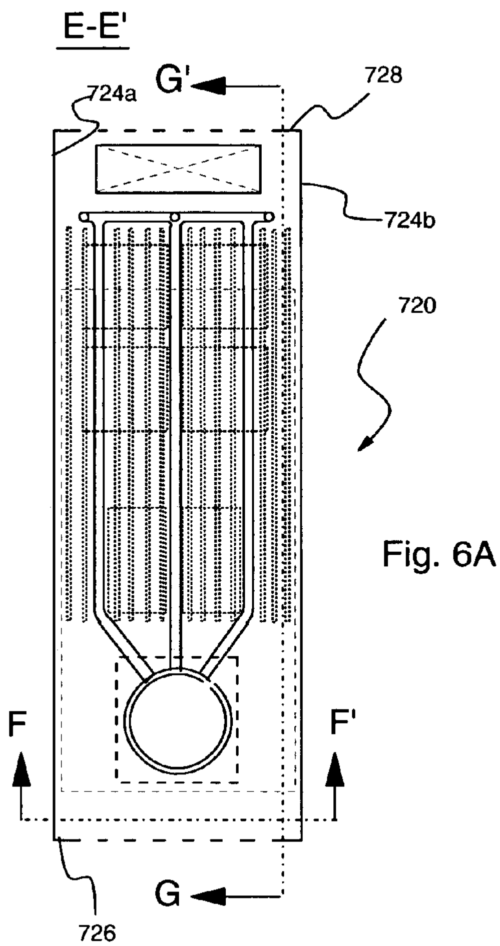
FIG. 6A illustrates a cross section of a drawer cooling cover assembly, taken along line E–E' of FIG. 6B, per an embodiment of the present invention.
Figure 6B:
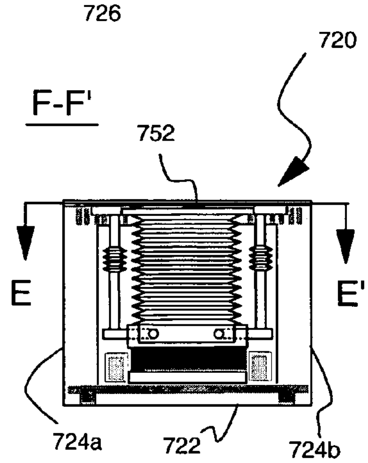
FIG. 6B illustrates a front cross section view of a drawer assembly per an embodiment of the present invention, taken along line F–F' of FIG. 6A.
Figure 6C:
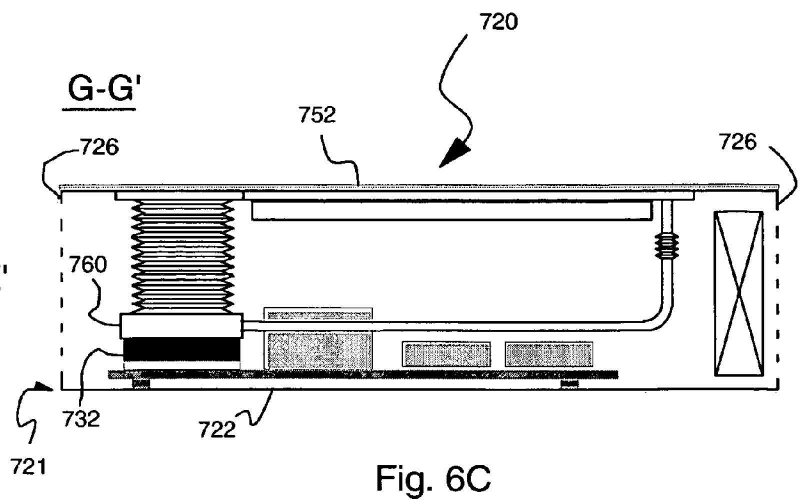
FIG. 6C illustrates a cross section of a drawer assembly per an embodiment of the present invention, taken along line G–G' of FIG. 6A.

With reference now to FIG. 6, further details of a drawer assembly are now described, per preferred embodiments of the present invention. FIG. 6 depict various views of drawer 720 incorporating cooling assembly 750. FIG. 6A illustrates a cross section of a drawer cooling cover assembly, taken along line E–E' of FIG. 6B. FIG. 6B illustrates a view of the front of drawer 720, taken in cross section at line F–F' of FIG. 6A. FIG. 6C illustrates a side cross section view of drawer 720, taken at line G–G' of FIG. 6A. Drawer 720 includes drawer frame 721, which is comprised of the following frame components as shown in FIG. 6: bottom 722, front 726, back 728, and sides 724. As shown in FIGS. 6A and 6C, front frame component 726 and back frame component 728 include air-permeable grilles, through which ambient air enters and exits drawer 720, respectively.

As previously noted, drawer cover cooling assemblies of the present invention, such as assemblies 350 and 750, are designed to transfer heat from a high power component to a set of air cooled fins in thermal contact with drawer cover 352 or 752. For simplicity, the discussion of drawer assembly techniques will refer to drawer 720, however the discussion applies to other embodiments of the present invention such as drawer 320. To maintain good thermal contact between high power component 732 and boiling chamber 760, assembly 750 includes a mechanical biasing component (conduit 762 and/or auxiliary spring 1063), which maintains a compressive force between boiling chamber 760 and high power component 732. Drawer 720 is assembled by securing cover 752 to at least two opposing components of frame 721. Cover 752 is preferably attached to frame 721 using mechanical fasteners as known in the art. Two preferred fastening methods are discussed below, however any mechanical fastening devices and methods may be used, provided two conditions are met. First, cover 752 should be easily disengagable from high power component 732 and all but one component of frame 721, or preferably completely detachable from frame 721, to provide easy access to components within drawer 720 for inspection, repair, replacement, etc. Second, cover 752 must be held in place with sufficient force to compress the mechanical biasing component (conduit 762 and/or spring 1063).

In one embodiment of the present invention, cover 752 is attached to frame 721 using a plurality of bolts (not shown). Assembly using bolts is best illustrated in FIG. 4B: here, cover 352 is lowered onto frame 321, resulting in the assembly depicted in FIG. 4A. Drawer 720 of FIG. 6 is assembled in the same manner. Bolts or other fasteners as known in the art are used to fasten at least each corner of cover 752 to frame 721: additional bolts may be used, particularly in the vicinity of conduit 762 and/or spring 1063.

Figure 9:
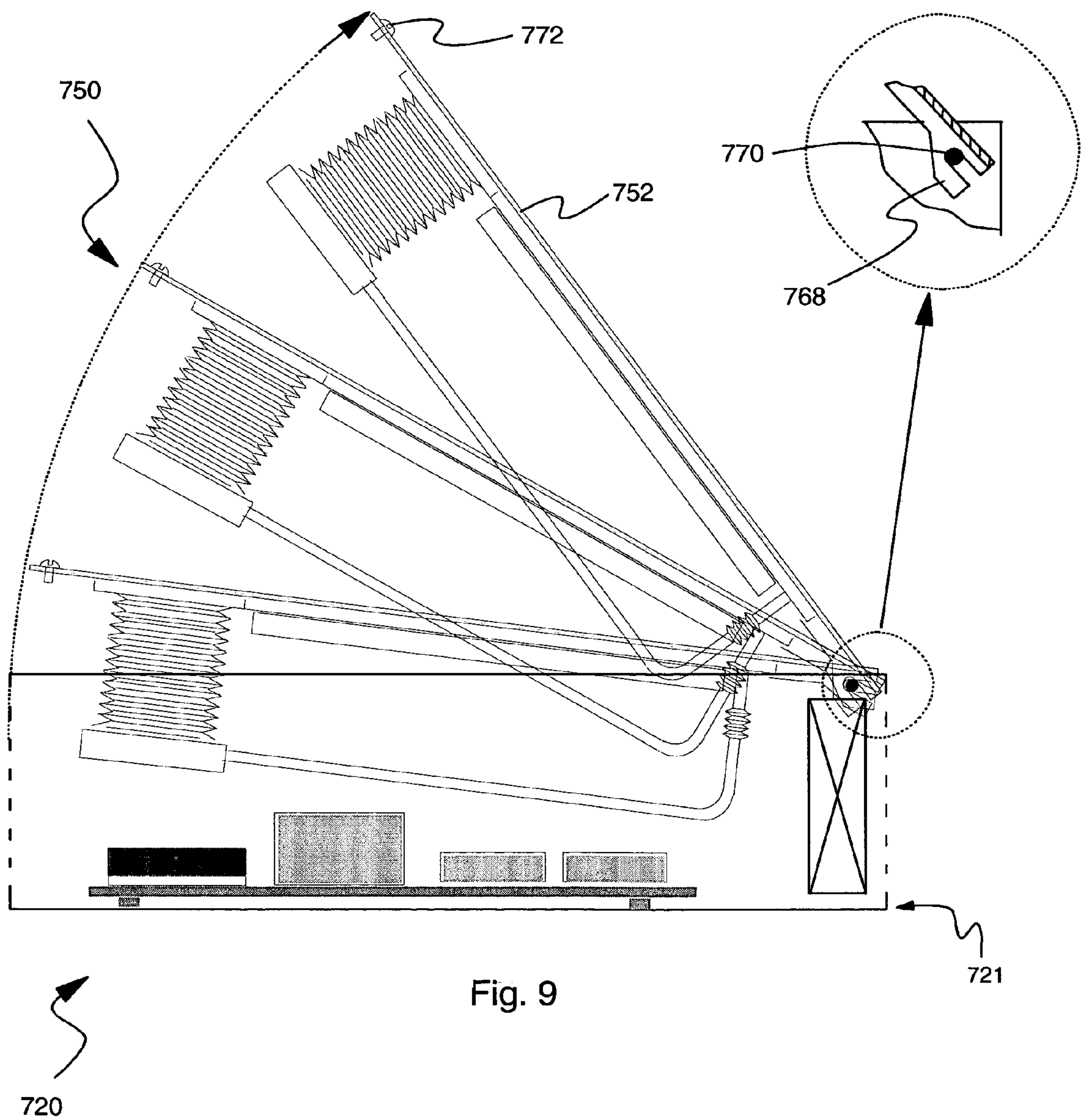
FIG. 9 illustrates a mechanism for attaching a cooling cover to a drawer frame, per an embodiment of the present invention.
Figure 10:
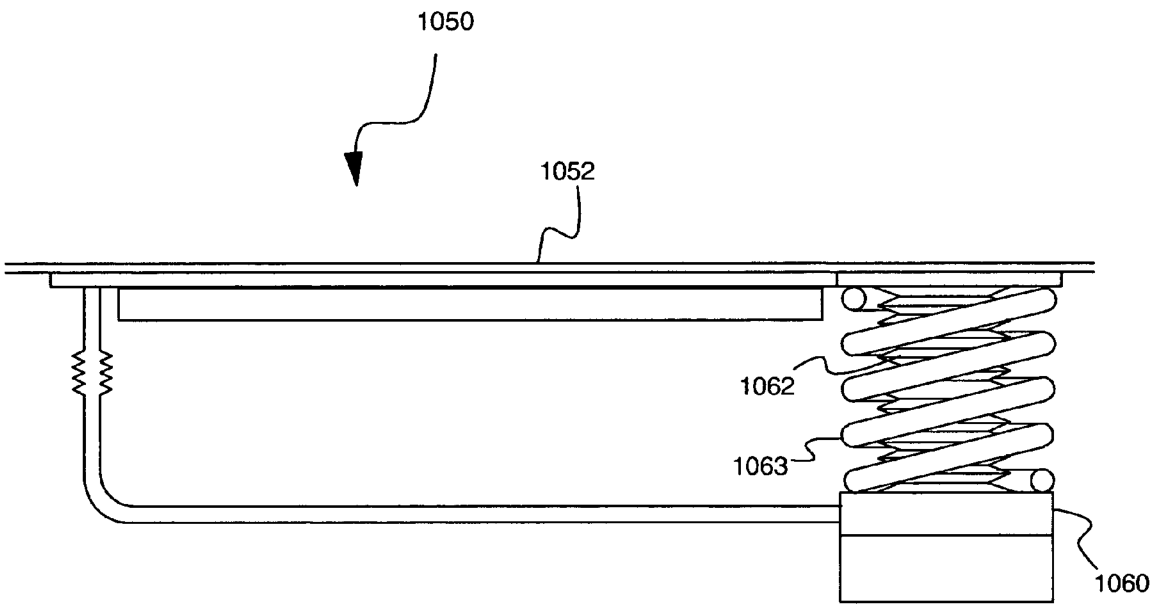
FIG. 10 illustrates an alternative conduit embodiment employing an auxiliary spring, per an embodiment of the present invention FIG. 11 illustrate cross sections of various cover, fin, and channel assemblies, per embodiments of the present invention.

In preferred embodiments of the present invention, cover 752 is pivotally mounted to one component of frame 721, and fastened to an opposing component of frame 721 using bolts or other mechanical fasteners as known in the art. One such embodiment is illustrated in FIG. 9. As shown in the detail view of FIG. 9, cover 752 includes a slotted end portion 768 on each side of the lower rear surface of cover 752. One pin 770 is placed on each side 724 of frame 721. Drawer 720 is assembled by first engaging pins 770 within slotted portions 768, as illustrated in FIG. 9. Drawer cover 752 is then lowered onto frame 721, thus compressing conduit 762 (and optional spring 1063, if present). Once lowered onto frame 721, cover 752 is secured to frame 721 using bolts 772 or other mechanical fasteners as known in the art, preferably located at the front corners of cover 752. Components within drawer 720 are accessible by disengaging assembly 750: bolts 772 are removed, and cover 752 is pivoted upwards as illustrated in FIG. 9. By thus disengaging assembly 750, components within drawer 720 are easily accessible for inspection, repair, maintenance, etc. The embodiment illustrated in FIG. 9 has the advantage of requiring a minimum number of bolts or mechanical fasteners, and has the further advantage of providing easy detachment of cover 752 by simply removing slotted portions 768 from pins 770, when cover 752 is pivoted open.

Alternatively, standard hinges can be used to pivotally mount cover 752 to rear frame component 728, however this alternative does not provide easy detachment of cover 752. This alternative provides an assembly 750 that is easily disengaged from high power component 732 and all but one component of frame 721.

While the invention has been described in detail herein in accord with certain preferred embodiments thereof, many modifications and changes therein may be effected by those skilled in the art. Accordingly, it is intended by the appended claims to cover all such modifications and changes as fall within the true spirit and scope of the invention.

What is claimed is:

1. A cooling apparatus comprising:
- a high thermal conductivity electronics drawer cover;
- a plurality of high thermal conductivity cooling fins in thermal contact with an underside of said cover;
- a fluid cooling loop including:
  - a plurality of high heat transfer fluid channels in thermal contact with said cover underside, said channels located in proximity to said fins;
  - a flexible vapor conduit, a first end of said vapor conduit being in fluid flow communication with a first end of said channels;
  - a high heat transfer boiling chamber in fluid flow communication with a second end of said vapor conduit;
  - at least one flexible condensate return conduit in fluid flow communication with a second end of said fluid channels, said return conduit also in fluid flow communication with said boiling chamber; and
- a mechanical biasing component in mechanical contact with said underside of said cover, and with an upper side of said boiling chamber.

2. The apparatus of claim 1, wherein said flexible vapor conduit is a metallic bellows, and said mechanical biasing component is also said metallic bellows.

3. The apparatus of claim 1, wherein said mechanical biasing component is a spring.

4. The apparatus of claim 1, further comprising a cooling fluid.

5. The apparatus of claim 4, wherein said cooling fluid is at a pressure below atmospheric pressure.

6. The apparatus of claim 5, wherein said cooling fluid boils at a temperature no higher than 60C.

7. The apparatus of claim 4, wherein said cooling fluid is selected from the group consisting of water, brine, refrigerant, and fluorocarbons.

8. The apparatus of claim 1, wherein said boiling chamber is constructed of a material selected from the group consisting of copper, aluminum, stainless steel, and nickel.

9. The apparatus of claim 1, said fluid flow channels further comprising:
- an inlet plenum at said channel first end, said inlet plenum distributing fluid from said vapor conduit to said plurality of channels; and
- an outlet plenum at said channel second end, said outlet plenum collecting fluid from said plurality of channels.

10. The apparatus of claim 1, wherein said flexible return conduit includes at least one inflexible portion and at least one flexible portion.

11. The apparatus of claim 1, wherein said channels and said fins are interdigitated.

12. A cooled electronic drawer apparatus comprising:
- a drawer frame, said drawer frame including a bottom, side components, a front air inlet component, and a rear air outlet component;
- an electronics board assembly connected to said drawer frame, said board assembly including a plurality of electronic components, said plurality of components including at least one high power component;
- at least one air moving device connected to said drawer frame;
- a cooling assembly disengagably connected to said drawer frame, said cooling assembly including:
  - a high thermal conductivity drawer cover;
  - a plurality of high thermal conductivity cooling fins in thermal contact with an underside of said cover;

a fluid cooling loop including:

a plurality of high heat transfer fluid channels in thermal contact with said cover underside, said channels located in proximity to said fins;

a flexible vapor conduit, a first end of said vapor conduit being in fluid flow communication with a first end of said channels;

a high heat transfer boiling chamber in fluid flow communication with a second end of said vapor conduit;

at least one flexible condensate return conduit in fluid flow communication with a second end of said fluid channels, said return conduit also in fluid flow communication with said boiling chamber; and a mechanical biasing component in mechanical contact with said underside of said cover, and with an upper side of said boiling chamber, and wherein said boiling chamber is in thermal contact with said at least one high power component when said cover is in a closed position.

13. The apparatus of claim 12, wherein said mechanical biasing component is compressed when said cover is in a closed position, said mechanical biasing component exerting a compressive force between said boiling chamber and said high power component.

14. The apparatus of claim 12, wherein said flexible vapor conduit is a metallic bellows, and said mechanical biasing component is also said metallic bellows.

15. The apparatus of claim 12, wherein said mechanical biasing component is a spring.

16. The apparatus of claim 12, wherein said electronics board assembly includes a plurality of high power components.

17. The apparatus of claim 12, further comprising a cooling fluid.

18. The apparatus of claim 12, wherein said cover is detachable from said drawer frame.

19. The apparatus of claim 18, wherein said cover is pivotally mounted to one of said frame components.

20. The apparatus of claim 12, wherein said cover is hingably mounted to one of said frame components.

21. A cooled electronic rack system comprising:

a rack frame;

at least one electronic drawer slidably mounted within said frame, said drawer including:

a drawer frame, said drawer frame including a bottom, side components, a front air inlet component, and a rear air outlet component;

an electronics board assembly connected to said drawer frame, said board assembly including a plurality of electronic components, said plurality of components including at least one high power component;

at least one air moving device connected to said drawer frame;

a cooling assembly disengagably connected to said drawer frame, said cooling assembly including:

a high thermal conductivity drawer cover;

a plurality of cooling fins in thermal contact with an underside of said cover;

a fluid cooling loop including:

a plurality of high heat transfer fluid channels in thermal contact with said cover underside, said channels located in proximity to said fins;

a flexible vapor conduit, a first end of said vapor conduit being in fluid flow communication with a first end of said channels;

a high heat transfer boiling chamber in fluid flow communication with a second end of said vapor conduit;

at least one flexible condensate return conduit in fluid flow communication with a second end of said fluid channels, said return conduit also in fluid flow communication with said boiling chamber;

a mechanical biasing component in mechanical contact with said underside of said cover, and with an upper side of said boiling chamber, and wherein said boiling chamber is in thermal contact with said at least one high power component when said cover is in a closed position.

22. The system of claim 21, including a plurality of said electronic drawers.

* * * * *